United States Patent
Furuta et al.

(10) Patent No.: US 8,114,243 B2
(45) Date of Patent: Feb. 14, 2012

(54) MOUNTING METHOD USING THERMOCOMPRESSION HEAD

(75) Inventors: Kazutaka Furuta, Tochigi (JP); Masaki Taniguchi, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 312 days.

(21) Appl. No.: 12/374,240

(22) PCT Filed: Jul. 18, 2007

(86) PCT No.: PCT/JP2007/064184
§ 371 (c)(1),
(2), (4) Date: Jan. 27, 2009

(87) PCT Pub. No.: WO2008/010516
PCT Pub. Date: Jan. 24, 2008

(65) Prior Publication Data
US 2009/0261149 A1    Oct. 22, 2009

(30) Foreign Application Priority Data

Jul. 19, 2006 (JP) .................................. 2006-197275

(51) Int. Cl.
*C09J 5/00* (2006.01)
*B32B 37/00* (2006.01)
(52) U.S. Cl. ....................... 156/323; 156/307.7; 438/118
(58) Field of Classification Search ................... 156/245, 156/323, 581, 583.3, 583.4, 289, 307.7; 438/108, 438/118, 119; 228/106
See application file for complete search history.

(56) References Cited

U.S. PATENT DOCUMENTS

| | | | | |
|---|---|---|---|---|
| 4,963,208 A | * | 10/1990 | Muncy et al. | 156/145 |
| 6,459,159 B1 | * | 10/2002 | Miyagawa et al. | 257/778 |
| 2006/0113356 A1 | * | 6/2006 | Matsumura et al. | 228/101 |
| 2008/0035274 A1 | * | 2/2008 | Kanisawa | 156/583.1 |

FOREIGN PATENT DOCUMENTS

| | | | |
|---|---|---|---|
| JP | 4-188840 | | 7/1992 |
| JP | 2003-086635 | | 3/2003 |
| JP | 2003109988 A | * | 4/2003 |
| JP | 2005-032958 | | 2/2005 |
| WO | WO 2006082744 A1 | * | 8/2006 |

OTHER PUBLICATIONS

Machine translation of JP 2003109988 date unknown.*

* cited by examiner

*Primary Examiner* — John Goff
(74) *Attorney, Agent, or Firm* — K&L Gates LLP

(57) ABSTRACT

A mounting method is provided using a thermocompression head which can mount an electric component in a short time with high connection reliability. The method is provided for mounting an electric component on a wiring board by using a thermocompression head having an elastic pressure bonding member composed of an elastomer on a heatable metal head main body. In the method, after arranging an adhesive agent on a mounting region on the wiring board, an electric component is arranged on a mounting region, and the electric component is bonded on the wiring board by thermocompression by using the thermocompression head. At the time of performing thermocompression bonding, while pressing a top region of the electric component by a metal portion of the head main body, and adhesive in the vicinity of a side portion region of the electric component is pressed by a taper section of the elastic adhesive member.

2 Claims, 4 Drawing Sheets

(a)

(b)

MOUNTING METHOD USING THERMOCOMPRESSION HEAD

CROSS REFERENCE TO RELATED APPLICATIONS

The patent application claims priority to Japanese Patent Document No. 2006-197275 filed on Jul. 19, 2006, the disclosure of which is herein incorporated by reference.

BACKGROUND

Generally, in a case where passive components such as resistors and capacitors are mounted on a wiring board, solder serving as a connecting material is melted in a reflow furnace so as to mount the passive components.

On the other hand, in a case where electric components such as an IC chips are mounted on a wiring board, the electric components are packaged and mounted by solder, or the IC chips are directly placed on the wiring board and mounted by wire bonding or flip chip.

In a case where such electric components are mounted by the flip chip using a conductive adhesive agent and the like, a hard pressure bonding head made of metal and/or ceramic and the like is generally used to perform thermocompression bonding.

In recent years, however, a pressure bonding head made of a member having elasticity such as silicone rubber is also used to perform the thermocompression bonding.

In a case where such an elastic member is used as the pressure bonding head, there is an advantage that not only a plurality of electric components having different heights can be bonded with pressure, but also a variety of different electric components such as the resistors and the capacitors in addition to the IC chips can be collectively bonded with the pressure in a simultaneous manner (e.g., patent document 1).

However, in a case where the pressure bonding head made of the metal and/or ceramic is used, insufficient heat with respect to a fillet portion of the adhesive agent on the periphery of the electric component generates a void in the course of the thermocompression bonding, causing a problem of deteriorating connection reliability.

On the other hand, in a case where the pressure bonding head made of the elastic member described above is used, heat from a side of the pressure bonding head is not adequate, causing a problem of prolonging a time for mounting.

Patent Document 1: Japanese Patent Laid-Open Publication 2005-32952

SUMMARY

The present disclosure relates to a technology for mounting a variety of electric components. More particularly, the present disclosure relates to a mounting method using a thermocompression head for mounting an electric component using an adhesive agent.

An object of the present invention is to provide a mounting method of mounting an electric component on a wiring board in a short time with high connection reliability using a thermocompression head.

To achieve the aforementioned objects, a method of mounting an electric component on a wiring board using a thermocompression head having an elastic pressure bonding member made of elastomer in a metal head main body made of heatable metal is provided. The method includes the steps of: disposing an adhesive agent in a mounting region on the wiring board; disposing the electric component in the mounting region; and thermally compressing the electric component on the wiring board using the thermocompression head. The thermally compressing step presses a top region of the electric component by a metal portion of the head main body while pressing the adhesive agent in a vicinity of a side portion region of the electric component by the elastic pressure bonding member.

According to an embodiment, a periphery of a metal pressing portion of the elastic pressure bonding member is formed in a taper shape, and the adhesive agent in the vicinity of the side portion region of the electric component is pressed toward the side portion region by the taper portion.

According to an embodiment, in a case of the thermocompression bonding, the heat and pressure is applied with respect to the top region of the electric component by the metal pressing member being in close contact therewith while applying the heat and pressure with respect to a fillet portion of the adhesive agent in the vicinity of the side portion region by the elastic pressure bonding member made of the elastomer. Consequently, the electric component is thermally compressed in a short time, and the thermocompression bonding can by performed with respect to the fillet portion of the adhesive agent on the periphery of the electric component in such a manner not to generate the void, thereby allowing connection of the electric component with high reliability by using the adhesive agent.

According to an embodiment, in a case where the thermocompression head formed in the taper shape in a portion on the periphery of the metal pressing member of the elastic pressure bonding member is used, and the adhesive agent in the vicinity of the side portion region of the electric component is pressed toward the side portion region by the taper portion, the taper portion of the elastic pressure bonding member contacts an edge portion of a surface of the electric component to be pressed in a case of the thermocompression bonding. Such a guidance movement allows the electric component to be smoothly in close contact with respect to a pressing surface of the metal pressing member, and the fillet portion of the adhesive agent on the periphery of the electric component is surely pressed by a surface of the taper portion of the elastic pressure bonding member, thereby reducing generation of a void.

According to the embodiments, not only an electric component is thermally compressed in a short time, but also a fillet portion of an adhesive agent on the periphery of the electric component is thermally compressed without generating a void, thereby allowing connection of the electric component with high reliability by using the adhesive agent.

Additional features and advantages are described herein, and will be apparent from, the following Detailed Description and the figures.

DETAILED DESCRIPTION

Hereinafter, a mounting method using a thermocompression head according to an embodiment will be explained in detail with reference to the drawings.

Figure 1:
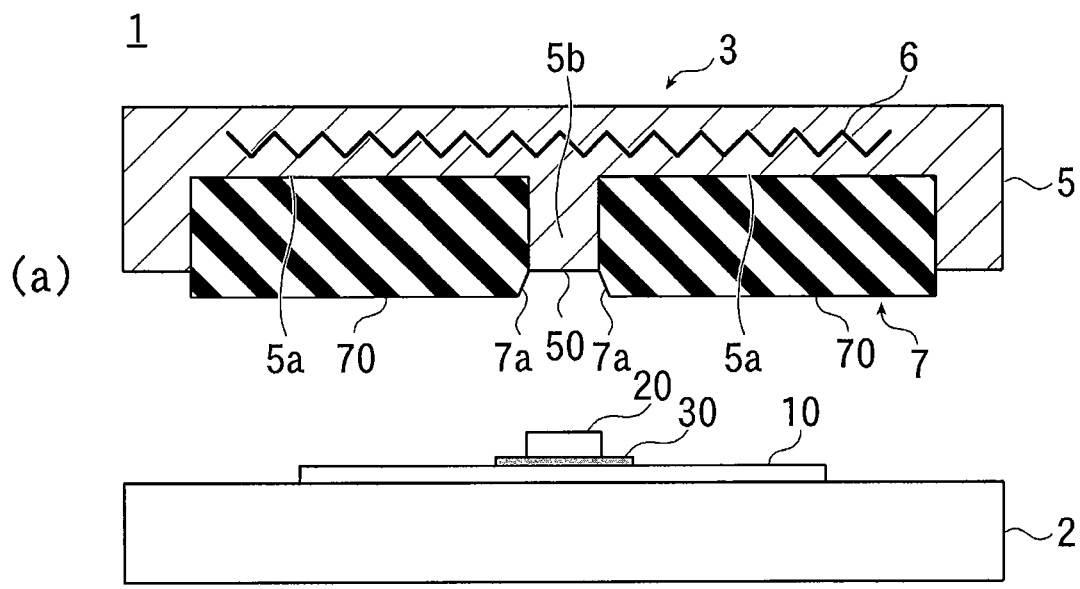
FIG. 1 (a) is a schematic partial cross-sectional view illustrating an example of a mounting device according to an embodiment, and FIG. 1 (b) is a schematic diagram illustrating a pressing side of a thermocompression head in the mounting device.
Figure 1:
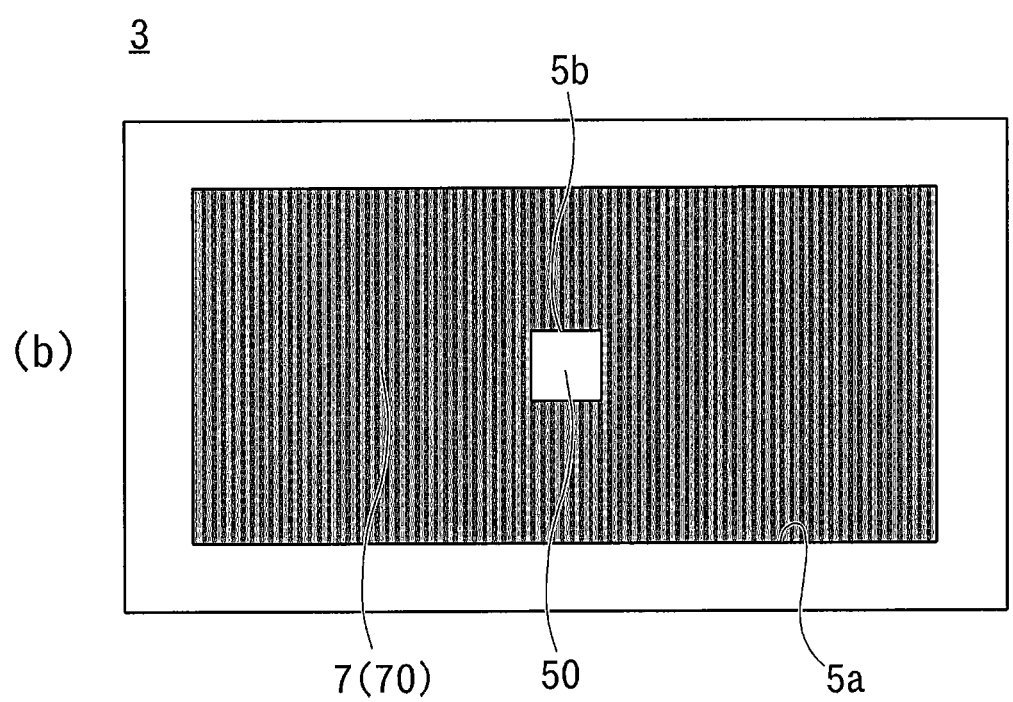

FIG. 1 (a) illustrates an example of a mounting device used in a schematic partial cross-sectional view, and FIG. 1 (b) illustrates an example of a pressing side of the thermocompression head in the mounting device in a schematic diagram.

Figure 2:
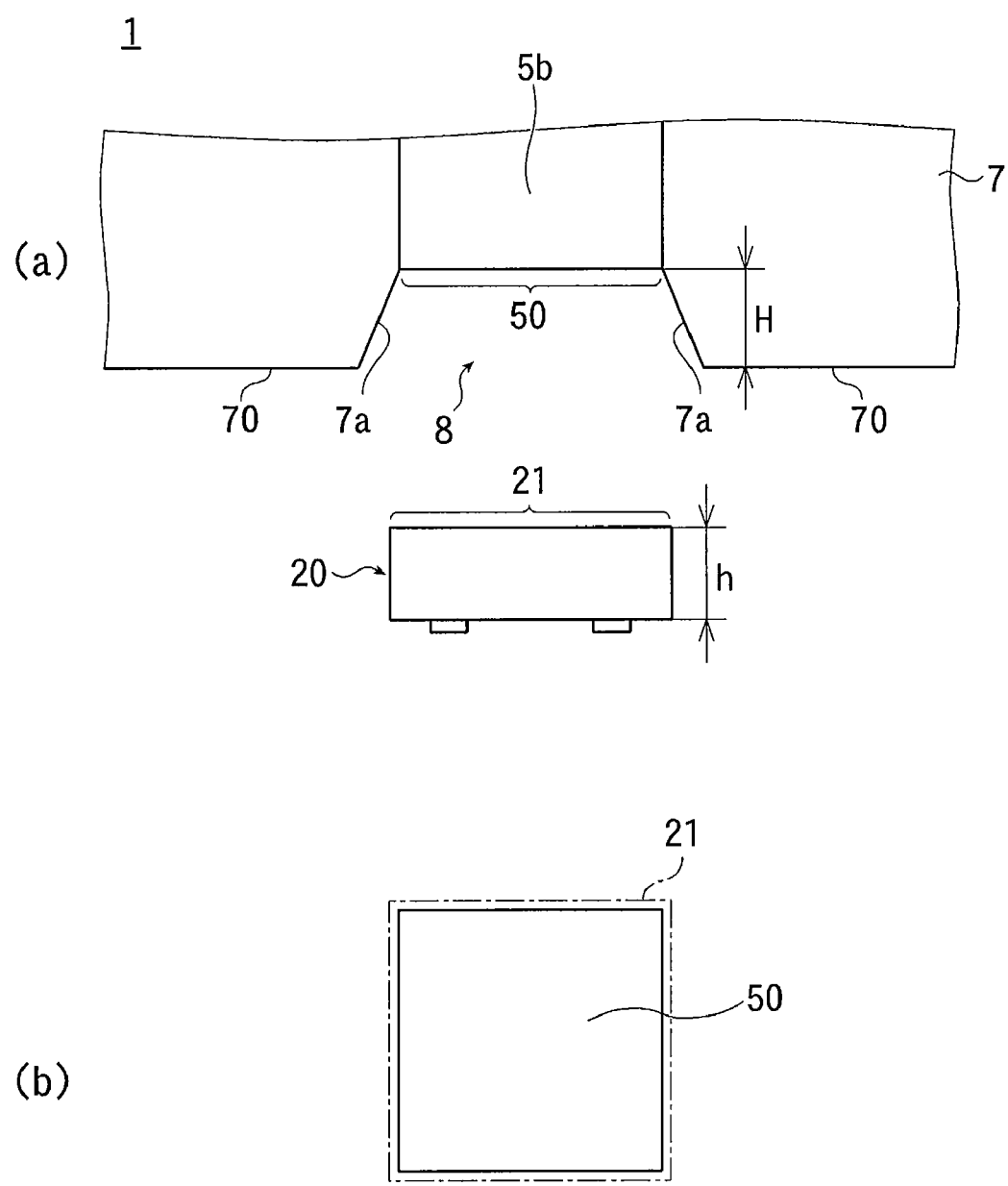
FIGS. 2 (a) and (b) are schematic diagrams illustrating a measurement relationship between a pressing surface of the thermocompression head and a top region of an electric component.

FIGS. 2 (a) and (b) illustrate a measurement relationship between a pressing surface of the thermocompression head and a top region of an electric component in schematic diagrams.

As illustrated in FIGS. 1 (a) and (b), a mounting device 1 according to the embodiment includes a base 2 placing thereon a wiring board 10 having a wiring pattern (not shown) and a thermocompression head 3 applying pressure and heat to an electric component 20 serving as a target to be thermally compressed such as an IC chip.

Herein, the base 2 is made of prescribed metal and includes a heater (not shown) for heating disposed inside thereof. The electric component 20 is in such a manner as to be disposed, through an adhesive agent 30, in a prescribed position on the wiring board 10 placed on the base 2.

Any one of an insulating adhesive agent and an anisotropic conductive adhesive agent can be used as the adhesive agent 30.

Among such agents, the anisotropic conductive adhesive agent is preferable from a standpoint of connection reliability enhancement.

Regarding the anisotropic conductive adhesive agent, a film form and a paste form can be used.

On the other hand, the thermocompression head 3 includes a head main body 5, for example, made of a metal material such as a stainless steel, and the head main body 5 includes a heater 6 for heating disposed inside thereof.

The head main body 5 is made of the metal member in a box frame shape, for example, and includes a recess portion 5a that is disposed in a portion opposite to the base 2.

A metal pressing member 5b (described later) is, for example, integrally provided in the head main body 5 by integral molding in a position (e.g., in a middle portion) corresponding to the electric component 20 of the recess portion 5a of the head main body 5.

Moreover, in the recess portion 5a of the head main body 5, an elastic pressing-bonding member 7 made of elastomer (silicone rubber and the like) in a plate shape, for example, is attached in such a manner as to be in close contact with the inside the recess portion 5a.

The elastic pressing-bonding member 7 is attached so that a pressing surface 50 of the metal pressing member 5b is exposed in a recessed state with respect to a surface 70 of the elastic pressing-bonding member 7 on the periphery of the metal pressing member 5b.

The metal pressing member 5b, for example, is formed in a quadrangular prism shape and has the pressing surface 50 of a rectangular plane shape in an end portion thereof.

In the embodiments, a size of the pressing surface 50 of the metal pressing member 5b is not particularly limited. However, the size of the pressing surface 50 is preferably arranged to be slightly smaller than a size of a surface of the electric component 20 to be pressed from a standpoint in which the heat and pressure is surely applied by the elastic pressure bonding member 7 in such a manner as not to generate a void with respect to a fillet portion of the adhesive agent 30 on the periphery of the electric component 20.

With the embodiment, for example, a size (outside dimension) of the pressing surface 50 of the metal pressing member 5b is preferably arranged to be slightly smaller than a size (outside dimension) of a top region 21 of the electric component 20 as illustrated in FIGS. 2 (a) and (b).

On the other hand, for example, a height difference "H" between the pressing surface 50 of the metal pressing member 5b and the surface 70 of the elastic pressure bonding member 7 is preferably arranged to be greater than a thickness "h" of the electric component 20 as illustrated in FIG. 2 (a) from a standpoint in which the pressure is surely applied in such a manner as not to generate the void with respect to the fillet portion of the adhesive agent 30 on the periphery of the electric component 20 although the embodiments are not particularly limited thereby.

Moreover, a portion on the periphery of the metal pressing member 5b of the elastic pressure bonding member 7 is preferably formed in a taper shape toward an outward of an opening 8 from a standpoint in which the pressing surface 50 of the metal pressing member 5b is smoothly in close contact with respect to the top region 21 of the electric component 20, and the pressure is surely applied in such a manner as not to generate the void with respect to the fillet portion of the adhesive agent 30 on the periphery although the embodiments are not particularly limited thereby.

In other words, a taper section 7a having a prescribed angle is formed in an opening wall surface portion of the elastic pressure bonding member 7, and the opening 8 on the pressing surface 50 of the elastic pressure bonding member 7 is preferably sized greater than the top region 21 of the electric component 20.

An angle of the taper section 7a of the elastic pressure bonding member 7 can be arranged as needed according to the sizes of the pressing surface 50 of the metal pressing member 5b and the top region 21 of the electric component 20 and the height "H" of the surface 70 of the elastic pressure bonding member 7 with respect to the pressing surface 50 of the metal pressing member 5b.

Figure 3:
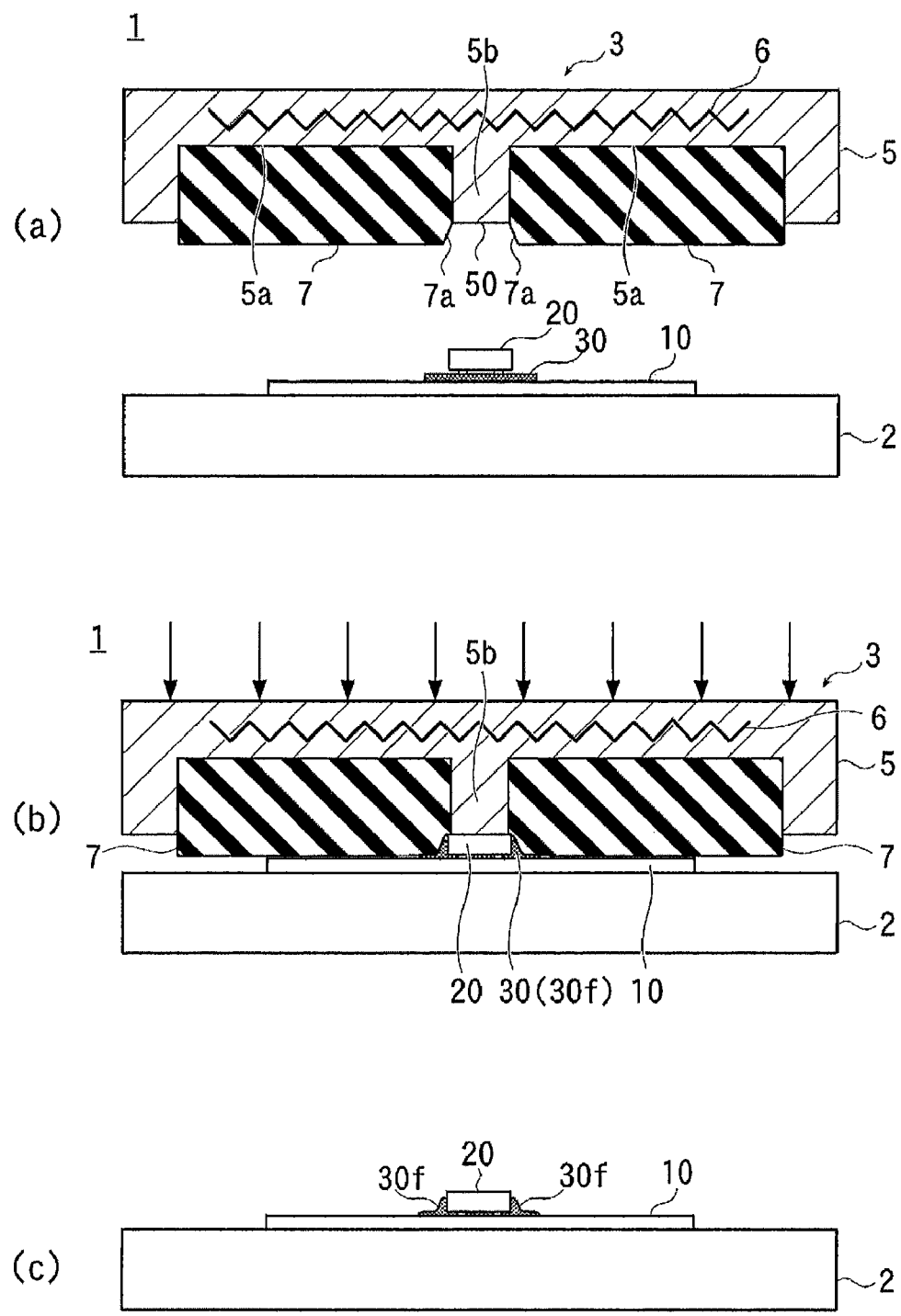
FIGS. 3 (a) through (c) are process diagrams illustrating a mounting method according to an embodiment.
Figure 4:
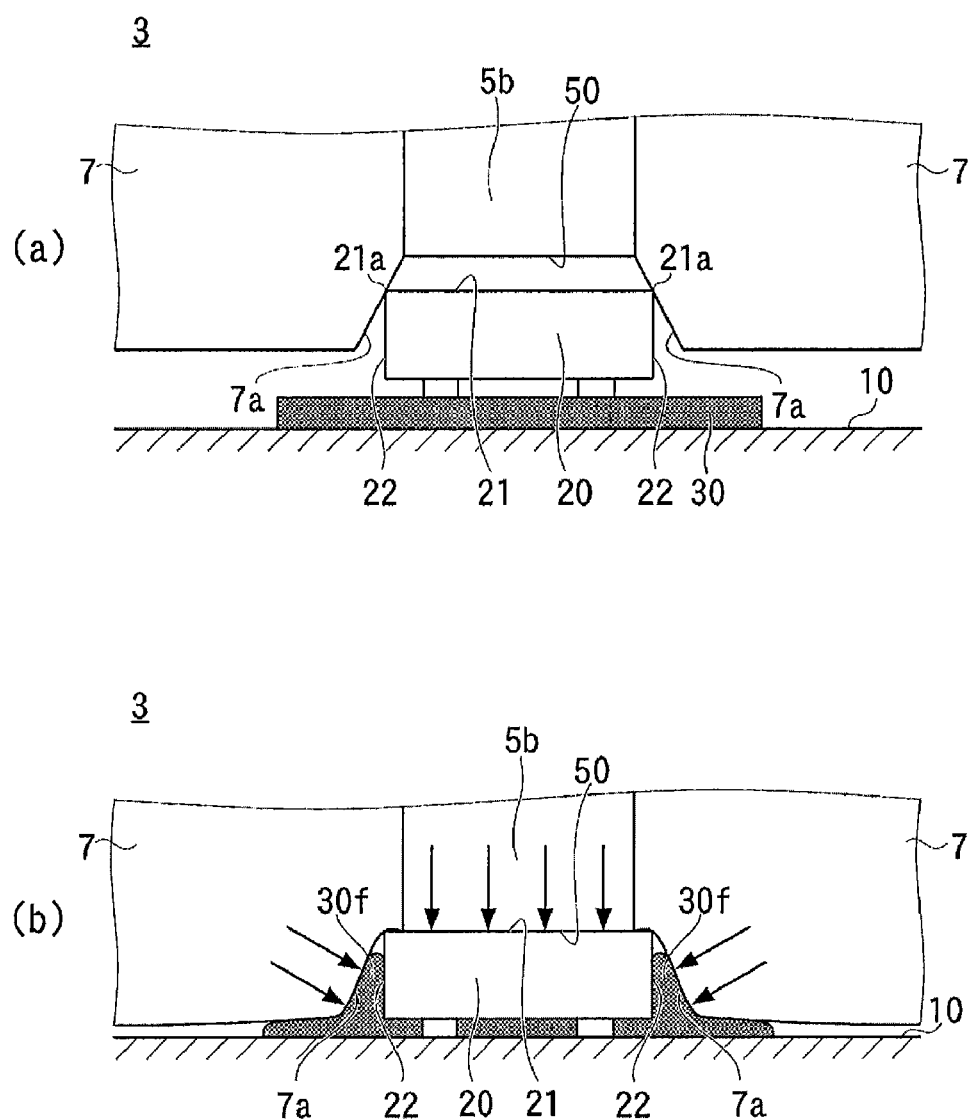
FIGS. 4 (a) and (b) are schematic diagrams illustrating essential portions of the mounting method.

FIGS. 3 (a) through (c) illustrate a mounting method according to the embodiment in process diagrams, and FIGS. 4 (a) and (b) illustrate portions of the mounting method in schematic diagrams.

In the embodiment, the adhesive agent 30 is provided on a mounting region of the wiring board 10 placed on the base 2, and the electric component 20 is disposed in a prescribed position on the adhesive agent 30 as illustrated in FIG. 3 (a).

Herein, the heater 6 disposed inside the head main body 5 is controlled, so that the metal pressing member 5b and the elastic pressure-bonging member 7 are heated to prescribed temperature, and the base 2 is heated to prescribed temperature.

After a protection film (not shown) is disposed on the electric component 20 and is thermally compressed in a tentative manner with a prescribed condition (positioning), the head main body 5 is moved downward as illustrated in FIG. 3 (b), so that the heat and pressure is applied with respect to the electric component 20 for a prescribed time period as the thermocompression in a permanent manner.

In a case where the head main body 5 is moved downward, as illustrated in FIG. 4 (a), the taper section 7a of the elastic pressure bonding member 7 contacts an edge 21a of the top region 21 of the electric component 20, and such a guidance movement allows the electric component 20 to be smoothly in close contact with respect to the pressing surface 50 of the metal pressing member 5b.

Moreover, as illustrated in FIG. 4 (b), the fillet portion 30f of the adhesive agent 30 on the periphery of the electric component 20 is pressed toward a side of a side portion region 22 of the electric component 20 by a surface of the taper section 7a of the elastic pressure bonding member 7.

Therefore, the electric component 20 is mounted on the wiring board 10 in a state that the fillet portion 30f of the adhesive agent 30 is adequately pressed.

According to the embodiment described above, in a case of the thermocompression bonding, the heat and pressure is applied with respect to the top region 21 of the electric component 20 by the metal pressing member 5b being in close contact therewith while applying the heat and pressure with respect to the fillet portion 30f of the adhesive agent 30 on the periphery by the elastic pressure bonding member 7 made of the elastomer. Consequently, the electric component 20 is thermally compressed in a short time, and the thermocompression bonding can by performed with respect to the fillet portion 30f of the adhesive agent 30 on the periphery of the electric component 20 in such a manner not to generate the void, thereby allowing connection of the electric component 20 with high reliability by using the adhesive agent.

The present invention is not limited to the embodiment described above, and numerous additional modifications and variations of the present invention are possible.

For example, one metal pressing member is provided to the head main body, and the thermocompression is performed with respect to one electric component in the above embodiment. However, the present invention is not limited thereto. A plurality of the metal pressing members may be provided to the head main body, and a plurality of electric components may be thermally compressed in a simultaneous manner.

Moreover, dispositions and shapes of the metal pressing member and the pressing surface of the thermocompression head used in the present invention may be modified as needed according to the electric component to be the target of the thermocompression bonding.

Moreover, the present invention may be applied to a variety of the electric components such as an IC chip and a capacitor.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method of mounting an electric component on a wiring board using a thermocompression head having an elastic pressure bonding member made of elastomer in a metal head main body made of heatable metal, the method comprising:
   disposing an adhesive agent in a mounting region on the wiring board;
   disposing the electric component in the mounting region; and
   thermally compressing the electric component on the wiring board using the thermocompression head,
   wherein the thermally compressing step presses a top region of the electric component by a metal portion of the head main body while pressing the adhesive agent in a vicinity of a side portion region of the electric component by the elastic pressure bonding member, wherein the metal portion directly contacts the electric component during pressing.

2. A method of mounting using the thermocompression head according to claim 1, wherein a periphery of the elastic pressure bonding member is formed in a taper shape, and the adhesive agent in the vicinity of the side portion region of the electric component is pressed toward the side portion region by the taper portion.

* * * * *